US012604701B2

(12) United States Patent
Eibl

(10) Patent No.: US 12,604,701 B2
(45) Date of Patent: Apr. 14, 2026

(54) MODULAR WAFER-CHUCK SYSTEM

(71) Applicant: ATT Advanced Temperature Test Systems GmbH, Planegg (DE)

(72) Inventor: Markus Eibl, Planegg (DE)

(73) Assignee: ATT Advanced Temperature Test Systems GmbH, Planegg (DE)

( * ) Notice: Subject to any disclaimer, the term of this patent is extended or adjusted under 35 U.S.C. 154(b) by 180 days.

(21) Appl. No.: 18/268,086

(22) PCT Filed: Dec. 17, 2021

(86) PCT No.: PCT/EP2021/086495
§ 371 (c)(1),
(2) Date: Jun. 16, 2023

(87) PCT Pub. No.: WO2022/129527
PCT Pub. Date: Jun. 23, 2022

(65) Prior Publication Data
US 2024/0063037 A1 Feb. 22, 2024

(30) Foreign Application Priority Data

Dec. 18, 2020 (DE) ..................... 10 2020 007 791.9

(51) Int. Cl.
*H01L 21/67* (2006.01)
*G01R 31/28* (2006.01)
(52) U.S. Cl.
CPC .... *H01L 21/67248* (2013.01); *G01R 31/2874* (2013.01)

(58) Field of Classification Search
CPC . H01L 21/67248; H01L 21/67; H01L 21/109; G01R 31/2874
See application file for complete search history.

(56) References Cited

U.S. PATENT DOCUMENTS

2002/0014894 A1* 2/2002 Yonezawa .......... G01R 31/2865
324/750.08
2004/0149041 A1* 8/2004 Jones .................... G01N 29/48
73/602

(Continued)

FOREIGN PATENT DOCUMENTS

DE 20 2005 014 918 U1 3/2007
JP 2006294873 10/2006

(Continued)

OTHER PUBLICATIONS

International Search Report dated Apr. 20, 2023.
Korean Office Action of Jan. 10, 2025 with translation.

*Primary Examiner* — Dominic E Hawkins
(74) *Attorney, Agent, or Firm* — Gerald E. Hespos; Michael J. Porco

(57) ABSTRACT
A modular wafer-chuck system is provided for mounting or clamping and temperature control of a wafer. The modular wafer-chuck system includes: a chuck for temperature control of a wafer; and a sensor module with at least one temperature-measuring apparatus for measuring a temperature of the sensor module and/or of the chuck and/or of a wafer mounted or clamped by the wafer-chuck system. The chuck has a coupling surface configured to detachably couple the sensor module, and the sensor module has a coupling surface configured to mount or clamp a wafer.

15 Claims, 7 Drawing Sheets

(56) References Cited

U.S. PATENT DOCUMENTS

| | | | |
|---|---|---|---|
| 2006/0158207 | A1 | 7/2006 | Reitinger |
| 2006/0292515 | A1 | 12/2006 | Hisai |
| 2008/0302513 | A1 | 12/2008 | Eibl |
| 2010/0193501 | A1 | 8/2010 | Zucker et al. |
| 2011/0141650 | A1 | 6/2011 | Fujisawa |
| 2012/0223730 | A1* | 9/2012 | Yamada ............. G01R 31/2891 |
| | | | 324/750.16 |
| 2017/0229331 | A1 | 8/2017 | Nosradi |
| 2020/0209072 | A1* | 7/2020 | Yamasaki .............. G01R 31/26 |
| 2020/0312766 | A1* | 10/2020 | Bhagavat ............ H01L 21/6836 |
| 2022/0334174 | A1* | 10/2022 | Eibl ................... G01R 31/2874 |

FOREIGN PATENT DOCUMENTS

| | | |
|---|---|---|
| JP | 2007-171046 | 7/2007 |
| JP | 2008309710 | 12/2008 |
| JP | 2011-109040 | 6/2011 |
| KR | 10 2019 0052993 | 5/2019 |
| WO | 2006072598 | 7/2006 |

* cited by examiner

MODULAR WAFER-CHUCK SYSTEM

BACKGROUND

Field of the Invention

The invention relates to a modular chuck-wafer system for mounting or clamping and temperature-control of a wafer, to a sensor module for a modular chuck-wafer system, and to a method for arranging modules of a modular wafer-chuck system.

Related Art

Chucks are used e.g. in the semiconductor industry, in particular in microelectronics and microsystem technology, for providing wafers, for example for examining geometric parameters of a wafer. Also, structures located on the wafer (electrical components such as diodes, transistors, integrated circuits, etc.) can be contacted with the aid of a test means (prober) and various functional tests can be carried out. Functional tests include, e.g. applying a voltage and/or a current to the structures and measuring specific parameters. For such functional tests it is particularly advantageous for the wafer or the structures of the wafer to be tested to have a certain temperature at the beginning of the test. This has the particular advantage that influences interfering with the test can be reduced or substantially avoided. In addition, there is usually a change in the temperature of the structures or of the wafer due to the interaction with the test means (prober), in particular upon contacting the structures with the prober and due to the current flows during the performance of the functional tests. It is therefore advantageous to continuously temperature-control the structures or the wafer or to control or regulate the temperature thereof, so that preferably substantially identical test conditions prevail for the functional tests. The temperature range in which functional tests are carried out is usually in the range from about −75° C. to about 400° C.

As a rule, a large number of temperature control elements are provided for heating and/or cooling the chuck or the wafer, with the temperature being controlled or regulated by means of a temperature sensor. In particular, the temperature of the chuck or wafer is monitored and, in the case of a deviation from a target temperature, the corresponding temperature control element(s) is/are controlled so that the temperature of the wafer or chuck is always substantially identical and substantially corresponds to the target temperature.

A chuck preferably has a contact surface adapted to a structure to be tested on a wafer. In particular, an arrangement of the temperature measurement adapted to the structure to be tested is advantageous to obtain improved temperature monitoring and/or control, e.g. during a functional test.

However, the manufacture of different chucks adapted to the different structures to be tested is extremely cost-intensive and associated with increased expenditure of time and resources.

It is therefore an object of the present invention to provide a modular chuck-wafer system, a sensor module, and a method for arranging modules of a modular wafer-chuck system in order to be able to carry out improved functional tests on wafers with different structures to be tested in a cost and resource-saving manner.

SUMMARY OF THE INVENTION

One aspect of the invention relates to a modular wafer-chuck system for mounting or clamping and temperature control of a wafer, comprising: a chuck for temperature control of a wafer; a sensor module comprising at least one temperature-measuring means for measuring a temperature of the sensor module and/or of the chuck and/or of a wafer mounted or clamped by the wafer-chuck system. The chuck has a coupling surface configured to releasably couple the sensor module. Additionally, the sensor module has a first coupling surface configured to mount or clamp a wafer, and a second coupling surface for coupling with the coupling surface of the chuck In particular, the chuck and/or the sensor module are self-contained units and can be used individually and/or independently of one another. In particular, the chuck of the modular wafer-chuck system is configured for coupling and/or temperature control of a wafer—without a coupled sensor module. Alternatively, and/or in addition, the sensor module of the wafer-chuck system is configured for coupling to any chuck and/or a wafer and for measuring the temperature of the coupled wafer.

Such a modular wafer-chuck system has the particular advantage that a sensor module adapted and/or customized to the structure of the wafer to be tested can be coupled to a standard chuck. For testing a wafer or a structure of a wafer, only the sensor module can advantageously be exchanged or replaced by another one. This eliminates the need to additionally manufacture a chuck to control the temperature of the wafer for different wafers or structures to be tested, since the sensor modules can be combined and/or coupled with any chucks. This further allows an optimized arrangement of the test environment, since permanently installed chucks can be used to test a plurality of different wafers and/or structures.

In particular, the modular wafer-chuck system does not have a direct link for transmitting electrical signals between chuck and sensor module. In other words, the chuck and the sensor module of the wafer-chuck system are self-contained units and can be used individually and/or independently of one another.

The modularity of the wafer-chuck system is characterized in particular by the fact that the chuck and the sensor module preferably are coupled to one another substantially exclusively via respective coupling surfaces. In the intended operation, the coupling surface of the chuck is oriented upward. The second coupling surface of the sensor module for coupling to the chuck preferably is aligned downward in the intended operation, with the first coupling surface of the sensor module for coupling to a wafer preferably being aligned upward in operation. When the sensor module is arranged on the chuck, the coupling surface of the chuck and the second coupling surface of the sensor module rest against and/or on top of one another.

The coupling surface of the chuck and/or the second coupling surface of the sensor module are preferably substantially flat and/or planar surfaces, which preferably have a substantially circular or rectangular shape. Preferably, the coupling surface of the chuck and the second coupling surface of the sensor module have substantially the same shape and/or size. Via these coupling surfaces, substantially only thermal energy can be transmitted from the chuck to the sensor module.

The chuck of the modular wafer-chuck system can preferably be coupled to and/or used with a plurality of different sensor modules. Alternatively, and/or in addition, the chuck is suitable for the temperature control and/or testing of a wafer even without a sensor module.

In addition, the modular wafer-chuck system has the advantage that one or more temperature-measuring sensors can be positioned in the sensor module and thus closer to the wafer or the structures to be tested. In addition, the design of the sensor module can be individually adapted to the desired requirements. This also offers advantages in particular with regard to the arrangement of the one or more temperature-measuring sensors, since e.g. there are no components for the temperature control of the system in the sensor module. Thus, the modular wafer-chuck system enables an increased number and/or an optimized distribution of temperature-measuring sensors. Accordingly improved temperature monitoring and/or control, in particular during a functional test, can be achieved.

Preferably, the chuck and/or the sensor module of the modular wafer-chuck system comprises at least one vacuum chamber for mounting or clamping a wafer. Further preferably, the chuck and/or the sensor module comprises at least one connection device for connecting a vacuum line.

For coupling the exchangeable sensor module to the chuck, the chuck preferably has one or more vacuum chambers on the coupling surface of the chuck. The vacuum chambers are connected to a connection device for connection to a vacuum line. In this way, a negative pressure can be generated in the one or more vacuum chambers, and the negative pressure enables the sensor module to be detachably coupled to the coupling surface of the chuck. Advantageously, the sensor module also has one or more vacuum chambers on the second coupling surface of the sensor module, so that a wafer can be mounted or clamped on or by the sensor module. Here, the sensor module can have a connection device for connection to a vacuum line. Alternatively, and/or in addition, the sensor module comprises one or more continuous vias, i.e. channels and/or holes enabling a transmission of the negative pressure from one or more vacuum chambers of the chuck to the wafer. In this way, the wafer can be mounted or clamped on the sensor module without the sensor module requiring a connection device for connection to a vacuum line. This configuration is particularly advantageous since a simplified design and/or simplified manufacture of the sensor module is achieved in this way.

Preferably, the modular wafer-chuck system comprises an insulation layer for detachable coupling to the chuck and/or the sensor module. Providing an insulation layer is particularly advantageous in the field of high-voltage tests to prevent damage to the chuck and/or the sensor module and their electronics and/or control/measuring devices connected thereto. An insulation layer can be arranged between the chuck and the sensor module and/or between the sensor module and the wafer. The insulation layer preferably is made at least partially from a material with a high specific resistance, such as aluminum oxide ceramic, boron nitride, steatite, porcelain, glass, (glass fiber-reinforced) plastic, silicone rubber, Teflon and/or epoxy resin. Preferably, the insulation layer has a high thermal conduction coefficient, so that the insulation layer has little or no influence on a temperature measurement and/or temperature control of the wafer-chuck system.

Further preferably, the exchangeable sensor module has a first communication interface for communicating with a temperature-measuring unit, the first communication interface being suitable for transmitting electrical signals from the at least one temperature-measuring means and the temperature-measuring unit being suitable for receiving electrical signals from the at least one temperature-measuring means of the sensor module. The temperature-measuring unit is preferably configured to process, in particular to combine and/or merge, measurement values from one or more temperature-measuring means. Particularly preferably, the temperature-measuring unit is configured to at least partially carry out the method for temperature control or regulation according to one aspect of the application.

Advantageously, the chuck for temperature control of the chuck and/or of the sensor module and/or of a mounted or clamped wafer comprises: a second communication interface for supplying and/or draining a temperature control medium into or from the chuck; and/or a third communication interface for communicating with at least one electrothermal converter of the chuck. Further preferably, the modular wafer-chuck system comprises: a control unit of a temperature control device in connection with the temperature-measuring unit and the second and/or third communication interface for: controlling or regulating the temperature of the chuck and/or the sensor module and/or the wafer based on the measured temperature of the sensor module and/or the chuck and/or the wafer.

The temperature of the chuck is controlled, e.g. by control and/or regulation, by the temperature control device or the control unit, as described below in this application.

Furthermore, the chuck can optionally have one or more temperature-measuring means that can also be supplied for temperature monitoring and/or temperature control and/or regulation of the chuck by the temperature control device and/or the control unit and/or the temperature-measuring unit.

A further aspect of the invention relates to a sensor module for coupling to a chuck of a modular wafer-chuck system, comprising: at least one temperature-measuring means for measuring a temperature of the sensor module and/or of a coupled chuck and/or of a wafer mounted or clamped by the sensor module and/or the chuck; a first coupling surface for mounting or clamping a wafer; and a second coupling surface for coupling to a chuck.

Advantageously, the sensor module further comprises: a plurality of temperature-measuring means; and/or at least one vacuum chamber for mounting or clamping a wafer; and/or a connection device for connecting a vacuum line; and/or a first communication interface for communicating with a temperature-measuring unit for controlling the temperature of a chuck. The first communication interface is suitable for transmitting electrical signals from the at least one temperature-measuring means and the temperature-measuring unit is suitable for receiving electrical signals from the at least one temperature-measuring means of the sensor module.

The sensor module is a self-contained unit that can have one or more of the above-described features of the sensor module of the modular wafer-chuck system. In particular, the sensor module is suitable for being coupled to different chucks and for forming a modular wafer-chuck system therewith.

Advantageously, the sensor module is a self-contained and independently usable unit for coupling to a wafer and measuring the temperature of the coupled wafer. The sensor module preferably is not configured to control the temperature of the sensor module and/or a coupled wafer and/or does not have a device(s) for temperature control, in particular no electrothermal converters.

A further aspect of the invention relates to a method for arranging modules of a modular wafer-chuck system, comprising: providing a chuck for temperature control of a wafer; and coupling a sensor module to a coupling surface of the chuck. The sensor module has: a first coupling surface configured to mount or clamp a wafer; and at least one temperature-measuring means is provided for measuring a temperature of the sensor module and/or of the chuck and/or of a wafer mounted or clamped by the wafer-chuck system.

Preferably, the method further comprises the step of: mounting or clamping a wafer with a first coupling surface of the sensor module; and, preferably, providing temperature control of the chuck, the sensor module and/or the mounted or clamped wafer.

Advantageously, the exchangeable sensor module is arranged on the coupling surface of the chuck and, preferably with the aid of negative pressure and/or vacuum and/or an applied magnetic field, is mounted or clamped thereon. A wafer can be mounted or clamped on the first coupling surface of the sensor module, in particular as described in the present application. Here, the first coupling surface of the sensor module preferably is arranged on the side of the sensor module facing away from the chuck.

The method can further include: arranging an insulation layer between chuck and sensor module and/or between sensor module and wafer.

The present method is used in particular to prepare for testing a wafer or the structures to be tested located on it. Furthermore, the method can include the test process and the method steps for controlling or regulating the temperature of the chuck for a wafer according to one aspect of the present application.

The aspects of the invention described in the process are also suitable for carrying out a method as described below and/or having features of the temperature control device and/or the wafer test system described below.

A further aspect relates to a method for temperature control or regulation of a chuck of a modular wafer-chuck system for a wafer, comprising the steps of: detecting the position of a test means for testing a wafer; determining the respective spatial distances between the test means and a plurality of temperature-measuring means of a sensor module for measuring a temperature of the sensor module and/or of the chuck and/or of a wafer mounted or clamped by the wafer-chuck system; selecting at least one temperature-measuring means among the plurality of temperature-measuring means as a reference temperature-measuring means; controlling or regulating the temperature of the chuck based on the temperature(s) of the sensor module and/or of the chuck and/or of the wafer measured by the selected reference temperature-measuring means.

In particular, such a method enables a simplified and advantageous temperature control of a wafer-chuck system or a wafer, since the temperature control of the entire chuck takes place substantially uniformly, for example by controlling all means for temperature control of the chuck. Thus, the method has low requirements in terms of process handling and/or the control or regulation electronics. In addition, there is no unnecessary heating and/or cooling of areas of the chuck or the wafer that are insignificant for the functional tests carried out.

Preferably, a sensor module has a platform for clamping a wafer, a wafer being mounted or clamped by the sensor module, e.g. by means of generating a magnetic field or a vacuum.

Preferably, a sensor module and/or a chuck comprises a plurality of temperature-measuring means arranged in or on the sensor module and/or chuck to measure a temperature of the sensor module and/or the chuck and/or the wafer at preferably several different locations.

The wafer is mounted or clamped by the sensor module in such a way that a test means, for example a probe needle or a probe card, can contact different locations on a wafer surface and test structures located in the wafer or on a surface of the wafer. Here, a plurality of probe needles or probe fingers preferably are aligned in such a way that they come into contact with contact surfaces of the structures to be tested and, e.g. by introducing a current or applying a voltage, can examine the properties of the structure.

The temperature of the chuck preferably is controlled or regulated substantially uniformly, i.e. substantially in the same manner or consistently, particularly preferably by uniform control of one or more means for temperature control of the chuck, such as several electrothermal converters arranged in or on a chuck.

Preferably, selecting a temperature-measuring means as a reference temperature-measuring means comprises the step of: selecting the temperature-measuring means that has the smallest spatial distance from the test means.

Preferably, the temperature of the chuck, and furthermore of the sensor module and/or of the wafer, preferably is controlled or regulated based on the measured temperature of an individual temperature-measuring means among the plurality of temperature-measuring means. Preferably, use is made of the temperature-measuring means or the measured temperature of the temperature-measuring means that has the smallest spatial distance from the test means or is closest to the current position of the test means. Thus, advantageously, the temperature-measuring means that potentially detects or records a temperature change in the area of the wafer in which the structure to be tested is located most precisely and/or first in terms of time is selected for controlling or regulating the temperature of the chuck and/or the coupled sensor module and/or the wafer as the reference temperature-measuring means.

Preferably, if the determined spatial distances of two or more temperature-measuring means are within a certain tolerance $T\pm$ and/or are substantially the same size, selecting the reference temperature-measuring means comprises the step of: selecting the temperature-measuring means among the two or more temperature-measuring means that the has the greatest amount of temperature difference $Tdiff$ and/or temperature change per time $Tgrad$; or selecting the two or more temperature-measuring means as reference temperature-measuring means. Controlling or regulating the temperature of the chuck is based on the mean or average of the temperatures measured by the reference temperature-measuring means. Here, the tolerance $T\pm$ can correspond e.g. to an equivalent of preferably less than about 10 cm, more preferably less than about 1 cm, more preferably less than about 0.1 cm. Substantially the same size preferably corresponds e.g. to a difference in the distances of less than about 10%, more preferably less than about 1%, more preferably than about 0.1%. The values can be selected according to the structural conditions, in particular the number and/or arrangement of the plurality of temperature-measuring means, and/or the desired behavior of the temperature control or regulation. Alternatively, two or more of the temperature-measuring means can be selected as reference temperature-measuring means, and the temperatures measured by the two or more reference temperature-measuring means, for example and preferably an average of the measured temperatures, can be used to regulate or control the temperature of the chuck.

Here, the temperature difference $Tdiff$ corresponds to the amount of the difference between the measured temperature $T(t)$ and:

a target temperature of the chuck or wafer $Tsoll$:

$$Tdiff = |T(t) - Tsoll|$$

or a previously measured temperature T(t–x) of the same temperature-measuring means:

$$Tdiff=|T(t)-T(t-x)|$$

or an average temperature of a plurality of temperature-measuring means Tavg:

$$Tdiff=|T(t)-Tavg|=|T(t)-(T1+T2+T3+ \ldots +TX)/X|.$$

Preferably, the temperature change per time Tgrad is compared within a certain time period t1:

$$Tgrad=|(T(x)-T(x+t1))/t1|.$$

In this way, that temperature-measuring means that detects the greatest temperature drop or the greatest temperature increase within a time period t1 can preferably be selected as the reference temperature-measuring means. The time period t1 is preferably less than about 5 seconds, more preferably less than about 1 second.

Particularly preferably, the spatial distance between the test means and a temperature-measuring means is determined based on vector coordinates. Here, the positions of the test means and the temperature-measuring means preferably are projected into a coordinate system and the connection vectors and further their amounts (lengths) are calculated to determine the respective distances between the test means and the temperature-measuring means. To determine the distance, 2D and/or 3D coordinates of the test means and the temperature-measuring means can be used, the 2D coordinates of the test means and/or the temperature-measuring means preferably relating to a plane parallel to the wafer surface. The exemplary, preferred determination of the distances based on vector coordinates is described in more detail in the detailed description of the figures.

A further aspect relates to a temperature control device for temperature control of a chuck and/or of a sensor module coupled to the chuck and/or of a wafer positioned or clamped by the modular wafer-chuck system, comprising: a first communication interface for communicating with a sensor module and/or a chuck, the first communication interface being suitable for transmitting electrical signals; a control unit in connection with the first communication interface. The control unit is configured for: receiving electrical signals from a plurality of temperature-measuring means for measuring the temperature of the chuck and/or of the sensor module and/or of a wafer; selecting one of the temperature-measuring means as a reference temperature-measuring means; controlling or regulating the temperature of the chuck based on the temperature(s) of the chuck and/or of the sensor module and/or of the wafer measured by the selected reference temperature-measuring means.

Preferably, the temperature control device is further suitable for selecting the temperature-measuring means that has the smallest spatial distance from a test means for testing the wafer as the reference temperature-measuring means.

Further preferably, the control unit of the temperature control device is suitable for selecting the temperature-measuring means that has the greatest amount of a temperature difference Tdiff and/or temperature change per time Tgrad as the reference temperature-measuring means, provided that the determined spatial distances of two or more temperature-measuring means are within a certain tolerance T± and/or are substantially the same size.

Particularly preferably, the temperature control device further comprises:

a second communication interface for supplying and/or draining a temperature control medium for controlling the temperature of the chuck into or out of the chuck; and/or a third communication interface for communicating with at least one electrothermal converter for controlling the temperature of the chuck.

A further aspect relates to a modular wafer-chuck system for testing a wafer, comprising: a chuck and a sensor module coupled thereto for providing or clamping and temperature control of a wafer, comprising a plurality of temperature-measuring means for measuring a temperature of the chuck and/or of the sensor module and/or of a mounted or clamped wafer; at least one test means for testing the wafer; a position detection means for detecting the position of the test means in relation to the wafer-chuck system and/or the wafer; a temperature control device described in the process.

In the following, individual embodiments for solving the object will be described by way of example with reference to the figures. Some of the individual embodiments described have features that are not absolutely necessary in order to carry out the claimed subject matter, but which provide desired properties in certain applications. Thus, embodiments that do not include all the features of the embodiments described below shall also be considered to be disclosed as falling under the technical teaching described. Furthermore, in order to avoid unnecessary repetition, certain features will only be mentioned in relation to individual embodiments described below. It should be noted that the individual embodiments shall therefore not only be viewed individually, but also viewed together. On the basis of this overview, the person skilled in the art will recognize that individual embodiments can also be modified by including individual or multiple features of other embodiments. It is pointed out that a systematic combination of the individual embodiments with one or more features described in relation to other embodiments can be desirable and practical and shall therefore be considered, and shall also be regarded as encompassed by the description.

DETAILED DESCRIPTION

Figure 1:
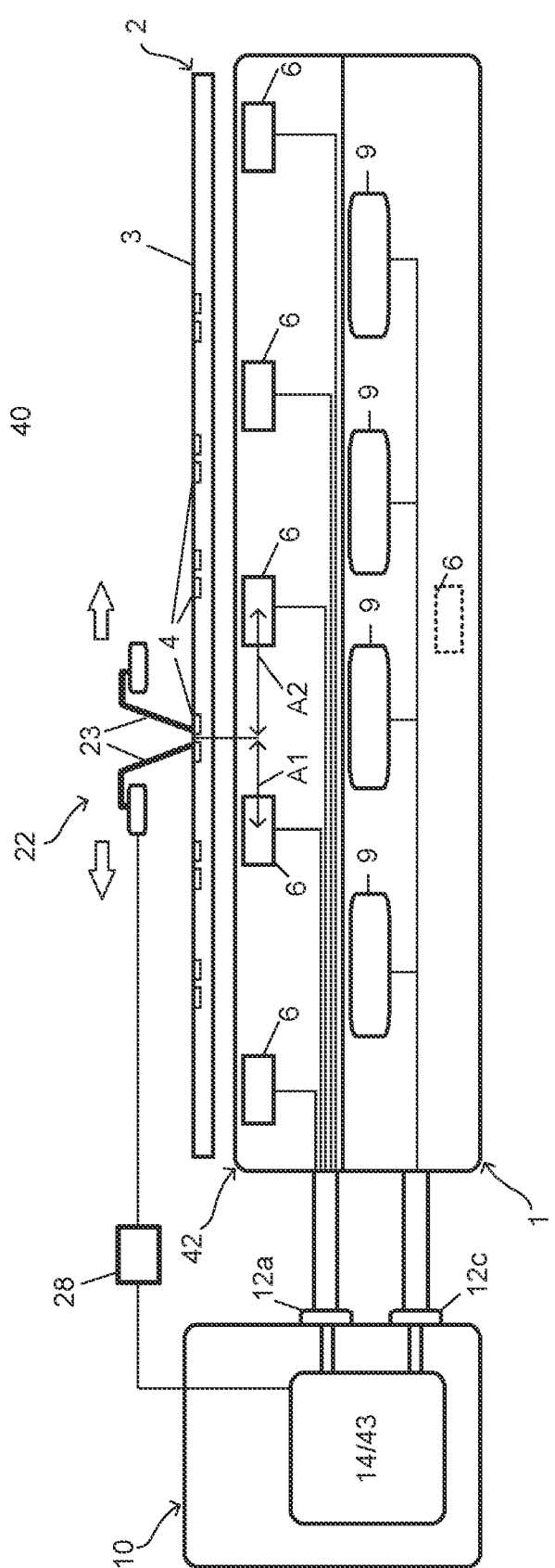
FIG. 1 shows an exemplary embodiment of a modular wafer-chuck system with a wafer mounted on a sensor module, a test means for testing the wafer, and a temperature control device that enables a temperature control of a chuck by means of a plurality of electrothermal converters.

FIG. 1 shows a sectional view of a modular wafer-chuck system 40 according to an exemplary, particularly preferred embodiment. The modular wafer-chuck system 40 shown comprises a chuck 1 or a holding or clamping device and a sensor module 42 detachably coupled to it, which mounts or clamps a wafer 2. The wafer 2 preferably is mounted parallel to a substantially flat surface of the chuck 1 and/or of the sensor module 42 by means of an applied magnetic field. Alternatively, the chuck 1 and/or the sensor module 42 can have a plurality of suction grooves (not shown) via which the wafer can be sucked by means of negative pressure and thus clamped or positioned by the modular wafer-chuck system 40.

As a result of the suction, the wafer 2 is pressed against the sensor module 42 or arranged on it, whereby a good heat transfer coefficient between the sensor module 42 and the wafer 2 is ensured. The same applies to the coupling of the sensor module 42 to the chuck 1.

The chuck 1 and/or the sensor module 42 preferably comprises a ceramic body, for example comprising aluminum oxide or aluminum nitride, and more preferably an electrically conductive shielding layer on the surface of the chuck 1 and/or of the sensor module 42 oriented toward the wafer 2. The wafer 2 is preferably in substantially surface contact with the shielding layer of the sensor module 42.

The wafer 2 preferably further has a wafer surface 3 comprising one or more structures 4 to be tested. The structures 4 to be tested are e.g. integrated circuits or electrical components (diode, transistor, etc.). Here, a wafer 2 can have a different number and/or arrangement of structures 4 to be tested, depending on the size of the wafer surface 3 and the structures 4 to be tested.

In this context, reference is made to particularly preferred embodiments of the chuck as described in patent specifications US 2008/302513 and DE 20 2005 014 918 U1, the contents of which are hereby incorporated into the present disclosure by reference.

The illustrated preferred embodiment of the modular wafer-chuck system 40 further comprises at least one test means 22 with which a structure 4 of the wafer 2 to be tested can be tested. Particularly preferably, a suitable test means 22 has one or more probe needles 23, each of which contacts a contact point of a structure 4 to be tested. The properties of the structures 4 can be examined or tested in this way, for example by introducing a current or applying a voltage and/or measuring voltages/currents by means of the probe needles 23. The control of the test means 22, in particular the alignment of the test means 22 in relation to the wafer 2 or to the structures 4, takes place e.g. by a (preferably separate) control device.

In the preferred embodiment of the modular wafer-chuck system 40 shown, the test means 22 is moved over the wafer 2 and aligned on the wafer surface 3 in accordance with the positions of the structures 4 to be tested. In addition, a position detection means 28 for detecting and/or checking the position of the test means 22 is preferably provided. Preferably, such a position detection means 28 receives the position of the test means 22 e.g. from an actuating or positioning device for moving the test means 22.

Alternatively and/or in addition, the position detection means 28 can detect the position of the test means 22 by means of sensors (e.g. infrared sensors, resistive sensors and/or magnetic sensors). The position of the test means 22 is detected or determined with the aid of the position detection means 28, preferably in relation to a reference element/point of the wafer 2 and/or the chuck 1 and/or the sensor module 42 (e.g. wafer surface 3, structure 4 of the wafer, temperature detection means 6 of the chuck 1 and/or of the sensor module 42).

Figure 2:
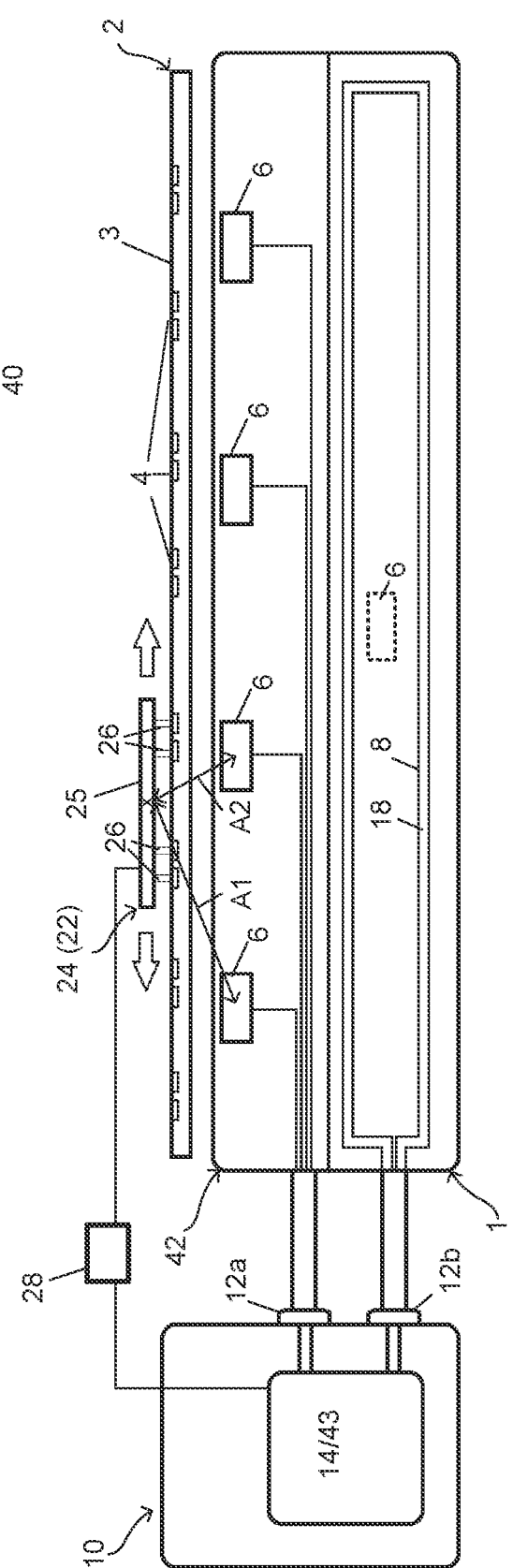
FIG. 2 shows an alternative exemplary embodiment of a modular wafer-chuck system comprising a chuck, a test means for testing the wafer, and a temperature control device that controls the temperature of the chuck by introducing a temperature control medium into the chuck.

As an alternative to the test means 22 described in the process, a test means 22 suitable for testing the wafer 2 can have a so-called probe card 24. Such a probe card 24 preferably comprises a circuit board 25 with a plurality of contact elements 26 that can be contacted with contact points of a plurality of structures 4 to be tested. The use of such a probe card 24 has the particular advantage that a plurality of the structures 4 can be tested substantially simultaneously or immediately one after the other without realigning the test means 22. FIG. 2 shows a further exemplary and preferred embodiment of a modular wafer-chuck system 40 with such a probe card 24 as a test means 22 for testing the structures 4 on the wafer 2.

In the preferred embodiment shown, the sensor module 42 of the modular wafer-chuck system 40 comprises a plurality of temperature-measuring means 6 suitable for measuring a temperature of the wafer 2 and/or the temperature of the sensor module 42 and/or the chuck 1 in a range close to or substantially adjacent to the wafer 2 (for example temperature sensors: PT100, PT500, PT1000, NTC, PTC, etc.).

In the embodiment shown, a plurality (preferably 5) of temperature-measuring means 6 are provided next to one another at substantially regular intervals and in a plane substantially parallel to the wafer surface 3. Preferably, the temperature-measuring means 6 are arranged in the sensor module 42 near the surface of the sensor module 42 on which the wafer 2 is clamped/mounted, so that the temperature of the wafer 2 advantageously can be transmitted to the sensor module 42. The chuck 1 of the modular wafer-chuck system 40 according to the exemplary embodiment shown preferably has one or more electrothermal converters 9 (for example electrical heating elements and/or Peltier elements) to enable controlling the temperature of the chuck 1 and, subsequently, of the coupled sensor module 42 and/or the wafer 2. Preferably, the chuck 1 has more than 5, more preferably more than 10 electrothermal converters 9 preferably arranged in the chuck 1 in a substantially evenly distributed manner, so that the temperature of the chuck 1 can advantageously be controlled, in particular cooled and/or heated. The chuck 1 of the modular wafer-chuck system 40 preferably has one or more temperature-measuring means 6, so that a temperature applied to the chuck 1 can be measured.

As an alternative to the exemplary embodiment of a chuck 1 described in the process, other means or features for temperature control or regulation of the chuck 1 can also be mounted. A further preferred embodiment of a chuck 1 for a modular wafer-chuck system 40 has a line 8 that is suitable for being flown through by a temperature control medium 18, in particular temperature-controlled air and/or temperature-controlled liquid. Preferably, the medium line 8 of the chuck 1 is designed in such a way that preferably a large part of the chuck 1 can be temperature controlled substantially uniformly by means of the temperature control medium 18 flowing through the medium line 8. Particularly preferably, the medium line 8 has a substantially meander-shaped course in the interior of the chuck 1 at least in part. FIG. 2 is a further exemplary and preferred embodiment of a modular wafer-chuck system 40 with a chuck 1, the temperature of which can be controlled or regulated by means of a temperature control medium 18.

The exemplary and preferred embodiment of a modular wafer-chuck system 40 shown in FIG. 1 preferably further comprises a temperature control device 10 for controlling or regulating the temperature control of the chuck 1 and/or of the sensor module 42 and/or of the wafer 2. Preferably, the temperature control device 10 comprises means for communicating with the sensor module 42 and/or with the chuck 1 of the modular wafer-chuck system 40, for example in the form of one or more communication interfaces 12 via which the temperature control device 10 can be connected to the chuck 1. Particularly preferably, the temperature control device 10 has at least one first communication interface 12a that is particularly suitable for transmitting electrical signals, in particular electrical signals from one or more temperature-measuring means 6 of the sensor module 42 to the temperature control device 10. Further preferably, the temperature control device 10 according to the exemplary, preferred embodiment has at least one further communication interface 12c that in particular enables communication with the one or more electrothermal converters 9 of the chuck 1, in particular control of the electrothermal converters 9.

The exemplary temperature control device 10 shown further preferably has a control unit 14 (e.g. (micro) controller, FPGA, etc.) that is connected to the one or more communication interfaces 12 and can communicate with the sensor module 42 and/or the chuck 1 via these interfaces. In particular, the control unit 14 is suitable for receiving, processing and/or evaluating the signals from the temperature-measuring means/temperature sensors 6 of the sensor module 42 and/or the chuck 1. Moreover, the exemplary and preferred embodiment of the control unit 14 of FIG. 1 is suitable for influencing or controlling/regulating the temperature of the chuck 1 and/or the sensor module 42 and/or the wafer 2. In particular, the control unit 14 is suitable for controlling the electrothermal converters 9 of the chuck 1 to increase, decrease and/or keep substantially constant the temperature of the chuck 1. Further preferably, the control unit 14 is designed to obtain the position of the test means 22 from the position detection means 28. Alternatively and/or in addition, the control unit 14 is preferably suitable for controlling or regulating a supply and/or drain-off a temperature control medium 18 for temperature control of the chuck 1 and/or the temperature of the temperature control medium 18. A detailed description of this will be given with reference to FIG. 2.

Moreover, the particularly preferred embodiment of the control unit 14 shown in FIG. 1 enables the temperature control device 10 to carry out a method for temperature control or regulation of a chuck 1 and/or of a detachably coupled sensor module 42 and/or of a wafer 2 mounted or clamped by a chuck 1, comprising the step of:

determining the respective spatial distances between the test means 22 and a plurality of temperature-measuring means 6 for measuring a temperature of the sensor module 42 and/or of the chuck 1 or of a wafer 2 clamped by the modular wafer-chuck system 40.

The control unit 14 in the preferred embodiment shown can determine the respective spatial distance between the test means 22 and the plurality of temperature-measuring means 6 of the modular wafer-chuck system 40.

An exemplary and preferred method suitable for this step comprises defining the positions of the test means 22 and of the plurality of temperature-measuring means 6 in a (preferably Cartesian) coordinate system. The position of the test means 22 preferably is approximated to a point or a substantially punctiform, infinitesimally small area, more preferably in a plane substantially parallel to the wafer surface 3. Particularly preferably, this point substantially corresponds to a geometric center of gravity of the test means 22 or its projection onto the plane defined by the temperature-measuring means 6 of the modular wafer-chuck system 40.

More preferably, a reference point is determined as the coordinate origin or pole/zero point of a two-dimensional coordinate system that preferably is located on the plane of the plurality of temperature-measuring means 6. Further preferably, the positions of the individual temperature-measuring means 6, as well as the test means 22, are approximated to a substantially punctiform, infinitesimally small area (preferably corresponding to the geometric center of gravity) and assigned to a coordinate in the coordinate system. Moreover, the control unit 14 determines the distances of the individual temperature-measuring means 6 from the test means 22, preferably by calculating the length (amount) of the connection vectors between the respective coordinates of the test means 22 and the temperature-measuring means 6.

The method described in the process for determining the spatial distances between the test means 22 and the individual temperature-measuring means 6 represents only an exemplary preferred embodiment. For example, the positions of the test means 22 or of the temperature-measuring means 6 can also be assigned to coordinates in a three-dimensional coordinate system (without projection to a certain plane—see FIG. 2). In addition, any alternative methods for determining the distances of the test means 22 from the temperature-measuring means 6 can be used.

Furthermore, the exemplary, preferred method for temperature control or regulation of a chuck 1, of a sensor module 42 detachably coupled to it and/or of a wafer 2 clamped by the modular wafer-chuck system 40 comprises the step of:

selecting a temperature-measuring means 6 from the plurality of temperature-measuring means 6 as a reference temperature-measuring means;

wherein preferably the temperature-measuring means 6 having the smallest spatial distance from the test means 22 is selected.

To this end, the control unit 14 preferably compares the determined spatial distances Ai of the individual temperature-measuring means 6 from the test means 22 and selects the temperature-measuring means 6 with the smallest distance Ai as the reference temperature-measuring means. Particularly preferably, if two or more temperature-measuring means 6 have substantially the same distance or distances with a difference less than a certain tolerance value T±(preferably less than about 1 cm, more preferably less than about 0.1 cm), a (further) selection among the temperature-measuring means 6 concerned takes place by choosing the temperature-measuring means 6 among the two or more temperature-measuring means 6 (the determined spatial distances of which from the test means 22 are within a certain tolerance T± and/or are substantially the same) that has the greatest amount of temperature difference Tdiff and/or temperature change per time Tgrad.

Alternatively, two or more of the temperature-measuring means 6 can also be selected as reference temperature-measuring means and, for example, an average of the temperatures measured by the reference temperature-measuring means can be used as the reference temperature for controlling the temperature of the modular wafer-chuck system 40.

For the case described in the process that two or more temperature-measuring means 6 are at a substantially identical distance from the test means 22, the temperatures or temperature profiles measured by the temperature-measuring means 6 concerned or having a substantially identical distance from the test means further preferably are compared:

Here, the individual temperature difference Tdiff of a temperature-measuring means 6 corresponds to the amount of the difference between a temperature measured by the temperature-measuring means 6 at the time t T(t) and:
a target temperature of the chuck or of the wafer Tsoll:

$$Tdiff = |T(t) - Tsoll|$$

or
a previously measured temperature T(t–x) of the same temperature-measuring means 6:

$$Tdiff = |T(t) - T(t-x)|$$

Figure 3:
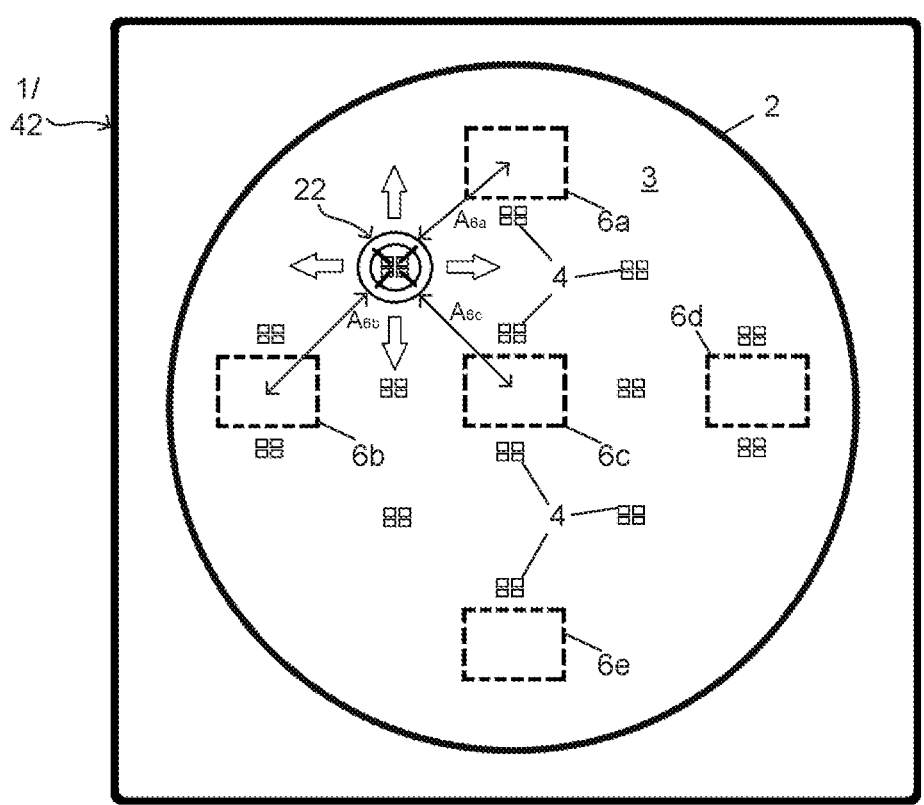
FIG. 3 shows a plan view of a modular wafer-chuck system and a mounted wafer with a plurality of structures to be examined as well as a test means for testing the plurality of structures to be examined and a plurality of temperature-measuring means of a sensor module.
Figure 4:
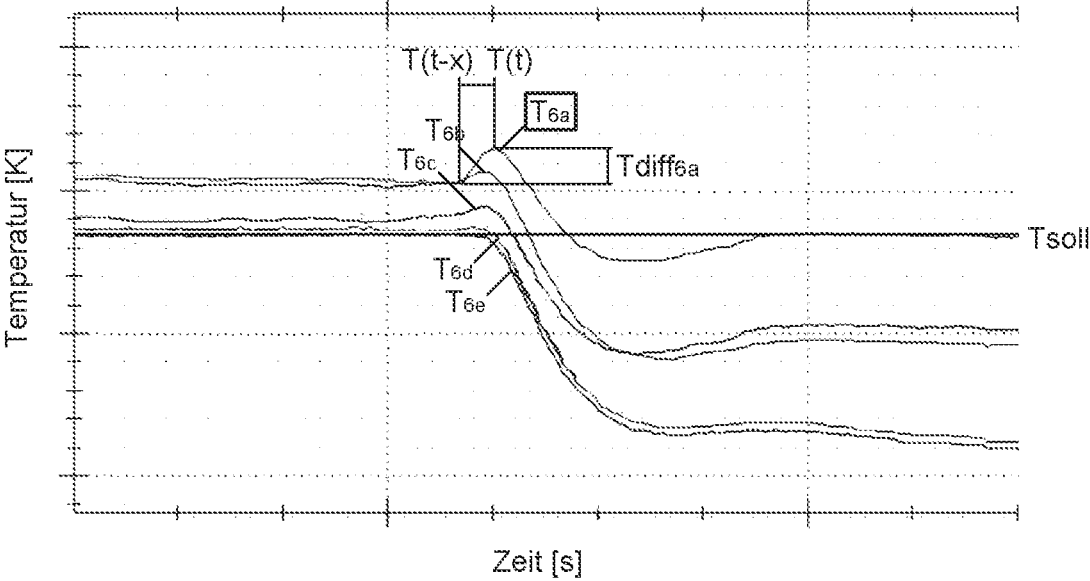
FIG. 4 shows an exemplary profile of the temperature of a sensor module, a chuck and/or a wafer measured by a plurality of temperature-measuring means of a sensor module.

(a selection process based on this temperature difference is shown as an example in FIGS. 3 and 4)
or
an average temperature of a plurality X of temperature-measuring means 6 (preferably all temperature-measuring means 6 of the chuck 1) Tavg:

$$Tdiff = |T(t) - Tavg| = |T(t) - (T1 + T2 + T3 + + TX)/X|.$$

The temperature change per time Tgrad within a certain period of time t1 preferably corresponds to the amount of a change in the temperature measured by a temperature-measuring means 6 over a duration or a period of time t1:

$$Tgrad = |T(x) - T(x+t1)|.$$

As a result, the temperature-measuring means 6 that detects the greatest temperature loss or the greatest temperature increase within a time period t1 subsequently is selected as the reference temperature-measuring means. The time period t1, over which the temperature profile is determined, is preferably less than about 5 seconds, more preferably less than about 1 second, more preferably less than about 0.1 seconds.

The parameters described in the process for (further) selecting one of the temperature-measuring means 6 from the temperature-measuring means 6 concerned can be used both alone and in any combination, possibly with different weighting, for the step of selecting the reference temperature-measuring means. The same applies to the determined distance of the temperature-measuring means concerned. In addition, further alternative parameters can also be used for selecting the reference temperature-measuring means.

Furthermore, the exemplary, preferred method for temperature control or regulation of a chuck 1 or of a wafer 2 clamped by a chuck 1 comprises the step of: controlling or regulating the temperature of the chuck 1 based on the temperature of the chuck 1 or the wafer 2 measured by the reference temperature-measuring means selected.

Preferably, the temperature of the entire chuck 1, i.e. preferably all means for temperature control of the chuck 1 (e.g. electrothermal converters, temperature control medium/medium line), is controlled substantially uniformly/identically, so that the temperature of the chuck 1 is controlled substantially uniformly.

For controlling or regulating the temperature of the chuck 1, preferably only the measured temperature of the selected reference temperature-measuring means is used. Preferably, the temperature measured by the reference temperature-measuring means is compared with a specified target temperature of the chuck 1 and/or of the sensor module 42 and/or of the wafer 2 and, for example, is adapted substantially to the target temperature of the chuck 1 and/or of the sensor module 42 and/or of the wafer 2 by correspondingly controlling the temperature control means (e.g. electrothermal converter 9) (see also FIG. 4). As a result, it is possible for different areas of the chuck 1 and/or of the sensor module 42, which influence the temperature of the wafer 2, to have different temperatures.

FIG. 2 shows a sectional view of a modular wafer-chuck system 40 according to a further exemplary and particularly preferred embodiment (similar to the embodiment in FIG. 1). The modular wafer-chuck system 40 shown comprises a chuck 1 and a sensor module 42 that clamps a wafer 2, preferably by means of a magnetic field or application of a negative pressure. The sensor module 42, like the sensor module 42 in FIG. 1, preferably has a plurality of temperature-measuring means 6 (e.g. PT100, PT500, PT1000, NTC, PTC) for measuring the temperature of the chuck 1 and/or of the sensor module 42 and/or of the wafer 2 that are connected to a control unit 14 via a first communication interface 12a. The modular wafer-chuck system 40, like the system in FIG. 1, is suitable for carrying out the method described in the process for controlling the temperature of a chuck 1 and/or of a sensor module 42 and/or of a wafer 2. The chuck 1 of the modular wafer-chuck system 40 preferably has one or more temperature-measuring means 6.

As an alternative to the modular wafer-chuck system 40 shown in FIG. 1, however, in the system shown in FIG. 2, a so-called probe card 24 is provided as a test means 22 for testing the wafer 2 or the structures 4 on the wafer 2. Such a probe card 24 preferably comprises a circuit board 25 with a plurality of contact elements 26, the plurality of contact elements 26 of the probe card 24 being arranged in such a way that they can be brought into contact with contact points of several structures 4 to be tested on the wafer 2. Thus, by aligning or positioning the test means 22 or the probe card 24 once, several structures can advantageously be tested substantially simultaneously and/or sequentially, thereby enabling the test method to be accelerated.

What also is shown is a different determination of the respective spatial distances between the temperature-measuring means 6 and the test means 22 or the probe card 24. Unlike in FIG. 1, the position of the probe card 24 is not projected onto a plane formed by the positions of the temperature-measuring means 6, but is determined according to an alternative method. This exemplary, preferred method assigns a coordinate in a three-dimensional (preferably Cartesian) coordinate system to the test means 22 (probe card 24) and the temperature-measuring means 6 and determines the length or the amount of the connection vectors in three-dimensional space. As described with regard to FIG. 1, the positions of the individual temperature-measuring means 6 and of the test means 22 preferably are approximated to a substantially punctiform, infinitesimally small area (preferably corresponding to the respective geometric center of gravity). The distances Ai correspond to the length (amount) of the connection vectors between the coordinates of the temperature-measuring means 6 and the test means 22.

Also different to the embodiment shown in FIG. 1, the means for temperature control or controlling or regulating the temperature of the chuck 1 comprises a temperature control medium 18 and a medium line 8, arranged in the chuck 8, for conducting the temperature control medium 18. For example, the temperature control medium comprises temperature-controlled air and/or temperature-controlled liquid and flows through the medium line 8 of the chuck to achieve temperature control (increasing/lowering/maintaining a temperature of the chuck 1). Preferably, the medium line 8 of the chuck 1 is designed to be substantially meander-shaped, at least in part, so that an advantageous temperature control of the chuck 1 can be achieved by means of the temperature control medium 18. According to the preferred embodiment shown, the temperature control device 10 has a corresponding communication interface 12*b* that is suitable e.g. for supplying and/or draining the temperature control medium into the chuck 1 or out of the chuck 1.

Preferably, a correspondingly configured control unit 14 is suitable for influencing or adapting the flow parameters, the temperature and/or the composition of the temperature control medium 18 as required. Various alcohols such as amyl alcohol (pentanol) and methanol, but also heptane, are particularly suitable as the temperature control medium. A thermal oil based on silicone oil is more suitable. A temperature control fluid containing perfluorinated polyether (e.g. available under the trade name Galden HT from Solvay Solexis SpA), poly(oxyperfluoro-n-alkylene) (e.g. available under the trade name Galden ZT from Solvay Solexis SpA) and/or a mixture of triethoxyalkylsilanes (for example available under the trade name DW-Therm from DWS Synthesetechnik) is preferably used. However, other substances known to the person skilled in the art can also be used. Further preferably, the chuck 1 can have several (independent) medium lines 8 that are preferably suitable for temperature control of a large part of the chuck 1 and can furthermore preferably be controlled substantially uniformly, so that a substantially uniform temperature control of the entire chuck 1 or all temperature control elements of the chuck can be used.

FIG. 3 shows a top view of a chuck 1 and/or of a sensor module 42 according to a preferred embodiment with a mounted or clamped wafer 2 that has a substantially circular wafer surface 3. The wafer has a plurality (preferably between 1 and about 1000; more preferably between about 5 and about 200; more preferably between about 10 and about 100; for example 14, as shown in FIG. 3) of structures 4 to be tested. The structures 4 are arranged in a substantially uniform pattern in or on the wafer 2 (wafer surface 3). In the exemplary embodiment shown, the sensor module 42 has a plurality (preferably between about 3 and about 20; for example 5, as shown in FIG. 3) of temperature-measuring means 6*a*, 6*b*, 6*c*, 6*d*, 6*e*, preferably PT-100 temperature sensors that preferably are located below the wafer 2. Alternatively, and/or in addition, other temperature sensors such as a PT series, PT500, PT1000, HTCs and/or NTCs can be provided in order to measure the temperature of the chuck 1 and/or of the sensor module 42 and/or of the wafer 2.

The temperature-measuring means 6*a*-6*e* preferably are arranged according to a pattern, as shown, and more preferably distributed substantially uniformly over the wafer surface 3. FIG. 3 also shows a test means 22 with a plurality (preferably 4) of probe needles 23 (not identified) that are suitable for contacting contact surfaces of the structures 4 to be tested to test them.

In the state of the test means 22 shown in FIG. 3, it is substantially located above one of the plurality of the structures 4 to be tested, with the probe needles 23 of the test means 22 respectively contacting a contact surface of the structure 4. In this state, the test means 22 has a position (preferably approximated, substantially punctiform and substantially corresponding to the geometric center of gravity) whose distance from the (preferably approximated, substantially punctiform and substantially corresponding to the geometric center of gravity) positions of the temperature-measuring means 6*a*, 6*b* and 6*c* is substantially identical (or wherein the distances between the test means 22 and one of the temperature-measuring means A6*a*, A6*b* or A6*c* each have a difference within a specified tolerance value T±). If such a case occurs when using the method described in the process for temperature control or regulation of the chuck 1 and/or of the modular wafer-chuck system 40, the reference temperature-measuring means preferably is selected among the temperature-measuring means 6*a*, 6*b* and 6*c* taking into account the temperature difference Tdiff and/or the temperature gradient Tgrad of the temperature-measuring means 6*a*, 6*b* and 6*c*.

FIG. 4 shows an exemplary temperature profile for the arrangement shown in FIG. 3 and described in the process. The profiles of the temperatures T6*a*, T6*b*, T6*c*, T6*d* and T6*e* measured by the temperature-measuring means 6*a*-6*e* are shown here. As described in the process, the reference temperature-measuring means on which the regulation or control of the temperature of the chuck 1 and/or of the sensor module 42 and/or of the wafer 2 is based is selected among the temperature-measuring means 6*a*, 6*b* and 6*c*. To this end, in the present preferred example, the temperature differences Tdiff of the temperature T(t) of the temperature-measuring means 6*a*-6*c* measured at the time t are compared with the temperatures of the respective temperature-measuring means 6*a*-6*c* measured at the time tx (i.e. a period of duration x before the time t):

$$Tdiff6a = |T6a(t) - T6a(t-x)|$$

$$Tdiff6b = |T6b(t) - T6b(t-x)|$$

$$Tdiff6c = |T6c(t) - T6c(t-x)|$$

In FIG. 3, the temperature difference Tdiff6*a* of the temperature-measuring means 6*a* is shown as an example or representative, which in this exemplary scenario also corresponds to the greatest temperature difference of the temperature-measuring means 6*a*-6*c*.

The temperature differences Tdiff6*a*, Tdiff6*b* and Tdiff6*c* are compared with one another and the temperature difference with the highest value is determined. According to the exemplary method, the temperature-measuring means 6 associated with the temperature difference with the highest value is selected as the reference temperature-measuring means. Consequently, in the present exemplary and preferred method, the temperature-measuring means 6*a* is selected as the reference temperature-measuring means and is used to control the temperature of the chuck 1 and/or of the sensor module 42 and/or of the wafer 2.

Further preferably, the temperature control (control or regulation of the temperature) is carried out by substantially adjusting the temperature measured by the temperature-measuring means 6*a*. As can be seen in FIG. 4, the temperature control influences each of the plurality of temperature-measuring means 6 and thus preferably substantially all or at least a large part of the areas of the sensor module 42 and/or of the chuck 1. In the present example, the temperature-measuring means 6*b*-6*e* measure a value (clearly) below the target temperature of the wafer 1 and/or of the sensor module 42 and/or of the chuck 1.

The method explained with regard to FIGS. 3 and 4 is only an exemplary, preferred embodiment of the method for temperature control of a chuck and/or of a sensor module and/or of a wafer. In particular the parameters used to select the reference temperature-measuring means can be varied depending on the requirements and/or desire. Here, for example, a temperature gradient of the temperature-measuring means can be selected or used as a determining parameter. The measured temperatures of two or more temperature-measuring means 6 can also be used as a reference value for the temperature control, for example by averaging the measured temperatures. The method of temperature control can also take place in an alternative manner, for example by substantially halving the difference between the temperature of the reference temperature-measuring means and the target temperature of the chuck 1 and/or of the sensor module 42 and/or of the wafer 2.

Figure 5:
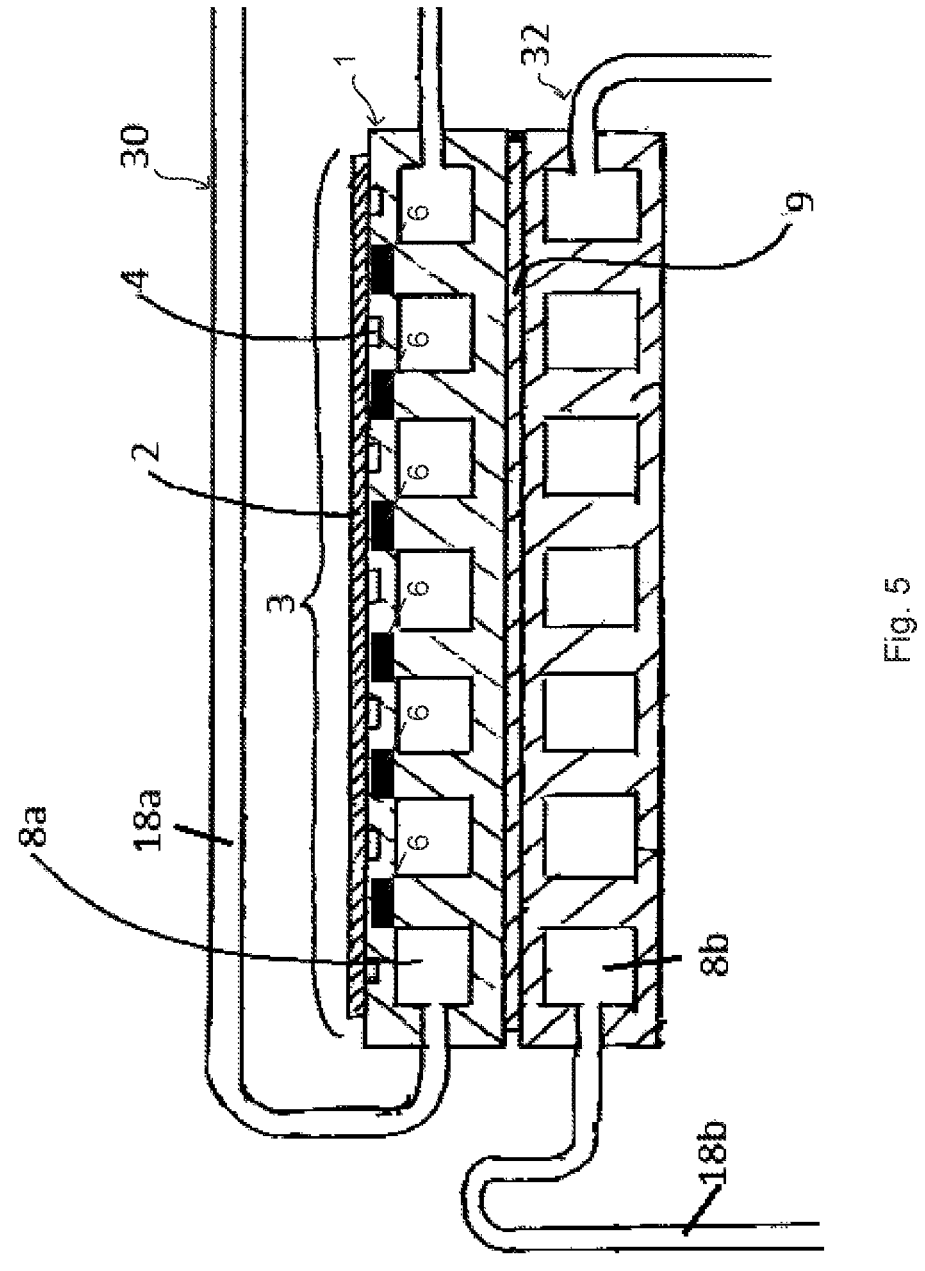
FIG. 5 shows an alternative exemplary embodiment of a modular wafer-chuck system comprising two separate temperature control circuits for different temperature control media.

FIG. 5 shows a further preferred embodiment of a chuck 1 for a modular wafer-chuck system 40, a temperature control of the chuck 1 being made possible by preferably different temperature control media 18a, 18b in preferably a first temperature control circuit 30 and a second temperature control circuit 32. More preferably, the two temperature control circuits 30, 32 each have a medium line 8a, 8b that extends at least in certain areas and substantially in a meandering manner. This exemplary and preferred embodiment enables advantageous temperature control of the chuck 1, since preferably different temperature control media 18 can be used for temperature control in different temperature ranges. For example, a first temperature control medium 18a is used for a first temperature range, for example for a range between about −75° C. and about 100° C., and a second temperature control medium 18b is used for a second temperature range, for example between about 50° C. to about 400° C. Various alcohols such as amyl alcohol (pentanol) and methanol, but also heptane, are particularly suitable as the temperature control medium 18. A thermal oil based on silicone oil is more suitably used. A temperature control fluid containing perfluorinated polyether (e.g. available under the trade name Galden HT from Solvay Solexis SpA), poly(oxyperfluoro-n-alkylene) (e.g. available under the trade name Galden ZT from Solvay Solexis SpA) and/or a mixture of triethoxyalkylsilanes (for example available under the trade name DW-Therm from DWS Synthesetechnik) preferably is used. However, other substances known to the person skilled in the art can also be used.

Furthermore, the chuck 1 of FIG. 5 preferably has one or more electrothermal converters 9 to enable a further advantageous temperature control of the chuck 1 and/or of the sensor module 42. The one or more electrothermal converters 9 are preferably particularly suitable for temperature control that can be precisely and quickly adjusted in a comparatively low temperature range of about +−50° C. The chuck 1 can have one or more temperature-measuring means 6 that can be connected to the temperature control device 10.

In this context, reference is made to the preferred embodiment of a chuck particularly suitable for this purpose, described in patent specification DE 10 2005 049 598 B4, the content of which is incorporated into the present disclosure by reference.

Figure 6:
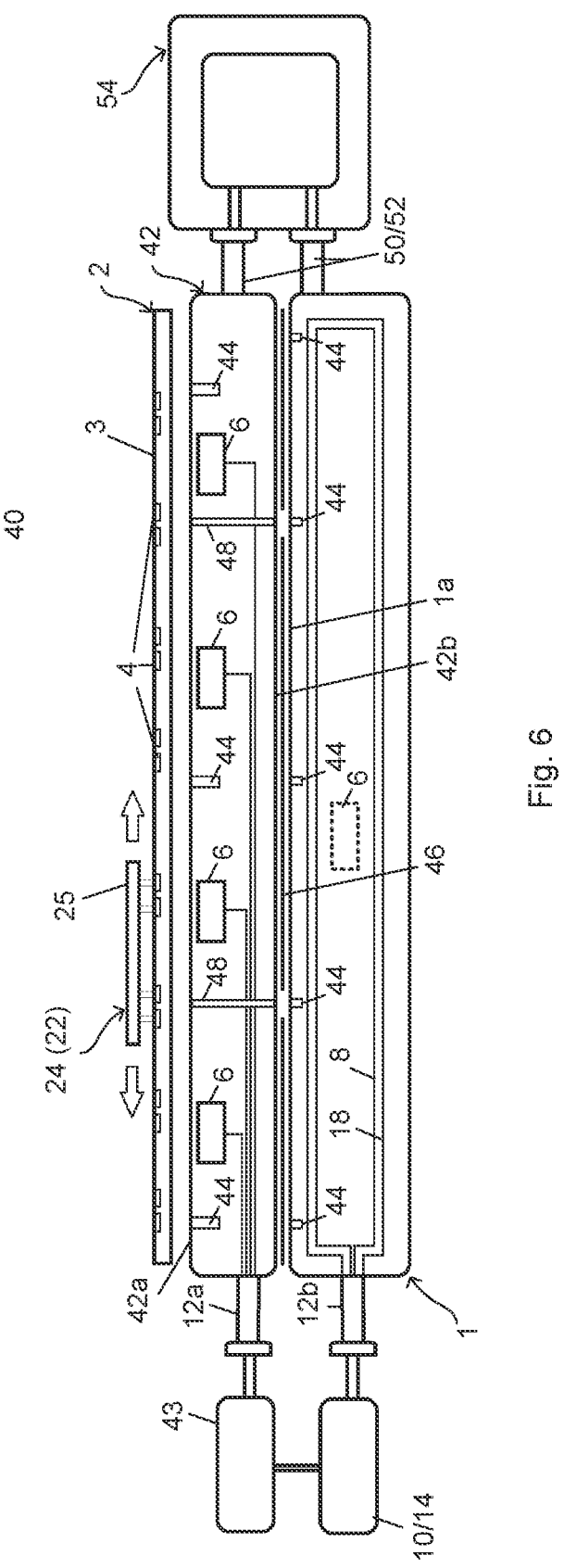
FIG. 6 shows a further exemplary embodiment of a modular wafer-chuck system.

FIG. 6 shows a further preferred embodiment of a modular wafer-chuck system 40 with a chuck 1 and a sensor module 42 coupled to the chuck 1. The example shown of the modular wafer-chuck system 40 further comprises at least one optional and exchangeable insulation layer 46 arranged between chuck 1 and sensor module 42. An insulation layer 46 is particularly advantageous in high-voltage applications and/or low-noise applications for electrically insulating the chuck 1 from the sensor module 42 and/or the wafer 2. According to an alternative embodiment, the modular wafer-chuck system 40 does not comprise an insulation layer 46 or an insulation layer 46 between sensor module 42 and wafer 2.

The sensor module 42 is coupled detachably and/or exchangeably to the chuck 1. This takes place e.g. by means of one or more vacuum chambers 44 connected to a vacuum line 52 via a connection device 50, via which a vacuum pump 54 can apply a vacuum and/or negative pressure to the vacuum chambers 44. As a result, the sensor module 42 is sucked and/or coupled to the chuck 1. Alternatively and/or in addition, the sensor module 42 can be coupled to the chuck 1 by applying a magnetic field. Mechanical coupling by means of one or more clamps and/or the like is also possible.

Coupling of the sensor module 42 to the chuck 1 is preferably such that substantially only the second coupling surface 42a of the sensor module 42 rests on the coupling surface 1a of the chuck 1 and/or abuts against it. As a result, there is advantageously and preferably only a coupling for temperature control and/or for the transmission of heat and/or cold between the chuck 1 and the sensor module 42. In particular, the chuck 1 and the sensor module 42 represent self-contained units, so that the chuck 1 is configured for coupling and temperature control of a wafer also individually and without a coupled sensor module, and so that the sensor module is configured for coupling to a (different) chuck and/or a wafer and measuring the temperature of the wafer.

If at least one optional insulation layer 46 is present, it preferably is designed in such a way that it has openings and/or depressions in the area of one or more vacuum chambers 44 of the chuck 1, so that a vacuum and/or a negative pressure in the vacuum chambers 44 can suck the sensor module 42 to the chuck 1. The insulation layer 46 preferably comprises a material with a high specific resistance, such as aluminum oxide ceramic, steatite, porcelain, glass, (glass fiber reinforced) plastic, silicone rubber, Teflon, boron nitride and/or epoxy resin. The insulation layer 46 preferably has a high thermal conduction coefficient, so that the insulation layer 46 has little or no influence on a temperature measurement and/or temperature control of the wafer-chuck system 40.

Similar to the chuck 1 in FIG. 2, the exemplary embodiment of the modular wafer-chuck system 40 of FIG. 6 has a second communication interface 12b by which a temperature control of the chuck 1 by means of a temperature control medium 18 can be achieved. The chuck 1 further has a medium line 8 arranged in the chuck 1 for conducting the temperature control medium 18. The temperature control medium comprises e.g. temperature-controlled air and/or temperature-controlled liquid or fluid and flows through the medium line 8 of the chuck to achieve a temperature control (increase/decrease/maintain a temperature of the chuck 1 and/or of the sensor module 42 and/or of the wafer 2).

Alternatively and/or in addition, the chuck 1 can have a third communication interface 12c to communicate with one or more electrothermal converters 9 (for example electrical heating elements and/or Peltier elements) arranged in the chuck 1, in particular to enable a temperature control of the chuck 1 and, subsequently, of the wafer 2. The chuck 1 preferably has more than 5, more preferably more than 10, electrothermal converters 9 preferably arranged in a substantially evenly distributed manner in the chuck 1, so that the chuck 1 advantageously can be temperature-controlled, in particular cooled and/or heated.

The temperature control of the chuck-wafer system 40 is controlled and/or regulated by a temperature control device 10 and/or by a control unit 14. For example, the temperature control can take place in accordance with the method described in the process.

The sensor module 42 can preferably have one or more vias 48, i.e. holes and/or channels that extend from a first coupling surface 42a to a second coupling surface 42b of the sensor module 42. The vias 48 are configured to transmit a negative pressure and/or a vacuum, which is applied to one or more vacuum chambers 44 of the chuck 1, through the sensor module 42 to a wafer 2 mounted on the first coupling surface 42a of the sensor module 42. Alternatively, and/or in addition, the sensor module 42 can have one or more vacuum chambers 44 on the first coupling surface 42a and at least one connection device 50 connected to the one or more vacuum chambers 44. By applying a negative pressure and/or vacuum to the connection device 50, a wafer 2 can be mounted or clamped on the first coupling surface 42a of the sensor module 42. Alternatively, and/or in addition, the sensor module 42 can be configured to generate a magnetic field that couples a wafer 2 to the coupling surface 42a.

The example of the sensor module 42 shown also has one or more, for example 4, temperature-measuring means 6 for measuring the temperature of the sensor module 42 and/or of a wafer 2 and/or of the chuck 1. As described with regard to FIGS. 1 and 2, such a temperature-measuring means 6 can comprise e.g. one or more PT100 temperature sensors. Alternatively and/or in addition, one or more NTC or PTC resistors or other suitable sensors can also be used to measure the temperature.

According to a particularly preferred embodiment, the sensor module 42 has one or more depressions, in particular one or more channels and/or grooves and/or holes, in which a circuit board 56 with one or more temperature sensors (temperature-measuring means 6) can be arranged at least partially and/or set in. Advantageously, the sensor module 42 has the one or more depressions on the second coupling surface 42b, i.e. on the coupling surface of the sensor module 42 that faces the chuck 1. This enables a simplified attachment or integration of one or more temperature-measuring means 6 in and/or on the sensor module 42. Alternatively, and/or in addition, the sensor module 42 can consist of two or more individual parts, between which the one or more temperature-measuring means 6 are arranged. This is particularly advantageous because both coupling surfaces 42a, 42b thus have a substantially closed surface that protects the one or more temperature-measuring means 6 from external influences.

The sensor module 42 preferably comprises one or more printed circuit boards 56 or circuit boards or PCBs, on which the one or more temperature-measuring means 6 are attached. This enables, on the one hand, a simple attachment of the temperature-measuring means 6 to or in the sensor module 42 and, on the other hand, the possibility of using temperature sensors (temperature-measuring means 6) in SMD (surface-mounted device) format. As a result, the manufacture of the sensor module 42 and/or the wafer-chuck system 40 can be simplified.

Figure 8:
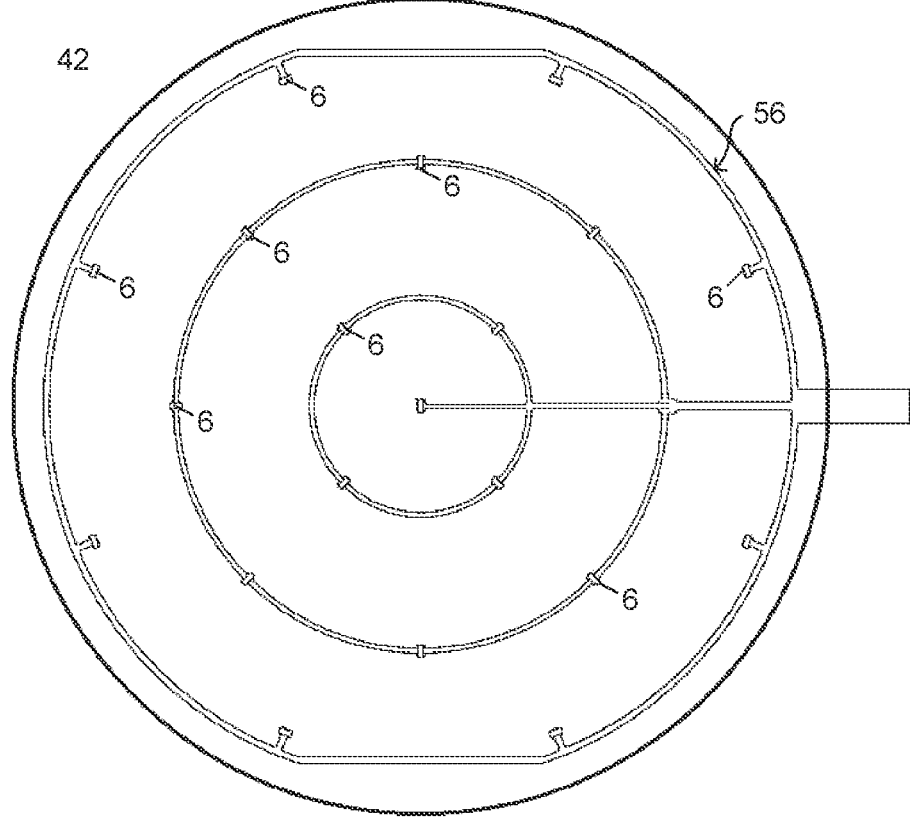
FIG. 8 shows an exemplary arrangement of temperature-measuring means in a sensor module for a modular wafer-chuck system.

The layout of the one or more circuit boards 56 and/or the arrangement of the one or more temperature-measuring means can vary depending on the requirements. A particularly preferred arrangement is shown in FIG. 8.

The chuck 1 can have one or more temperature-measuring means 6 that preferably also can be used for temperature regulation or control. In particular, electrical signals can be fed from the one or more temperature-measuring means 6 of the chuck 1 to the temperature-measuring unit 43 and/or the temperature control device 10 and/or the control unit 14.

The material from which sensor module 42 and/or chuck 1 are made preferably comprises one or more of: aluminum, aluminum alloys, copper, copper alloys, ceramics, such as SiC, SiSiC, AlN, Si3N4, Al2O3 or cordierite, and/or glass & glass ceramics, such as borosilicate glass or quartz glass. The sensor module 42 and/or the chuck 1 advantageously have a coating comprising gold and/or nickel. In this way, in particular, a reduced contact resistance, increased thermal conductivity or temperature coupling and/or increased dimensional stability can be achieved.

In addition, one or more structures, such as knobs, can be attached to the coupling surface of the chuck 1 and/or the first and/or second coupling surface of the sensor module 42 to reduce and/or define the contact area between chuck 1 and sensor module 42 or sensor module 42 and wafer 2 and/or to increase it as desired.

Preferably, the chuck 1 and/or the sensor module 42 and/or their coupling surface(s) have a diameter between about 100 mm and about 305 mm, preferably between about 150 mm and about 205 mm. The sensor module 42 preferably has a height between about 5 mm and about 30 mm, preferably between about 7 mm and about 13 mm. The chuck 1 and/or sensor module 42 and/or their coupling surface(s) can, however, also assume any shape (deviating from circular) according to the shape and/or dimension of the wafers to be attached to it. For special applications, e.g. substantially rectangular/square chucks can be used.

Figure 7:
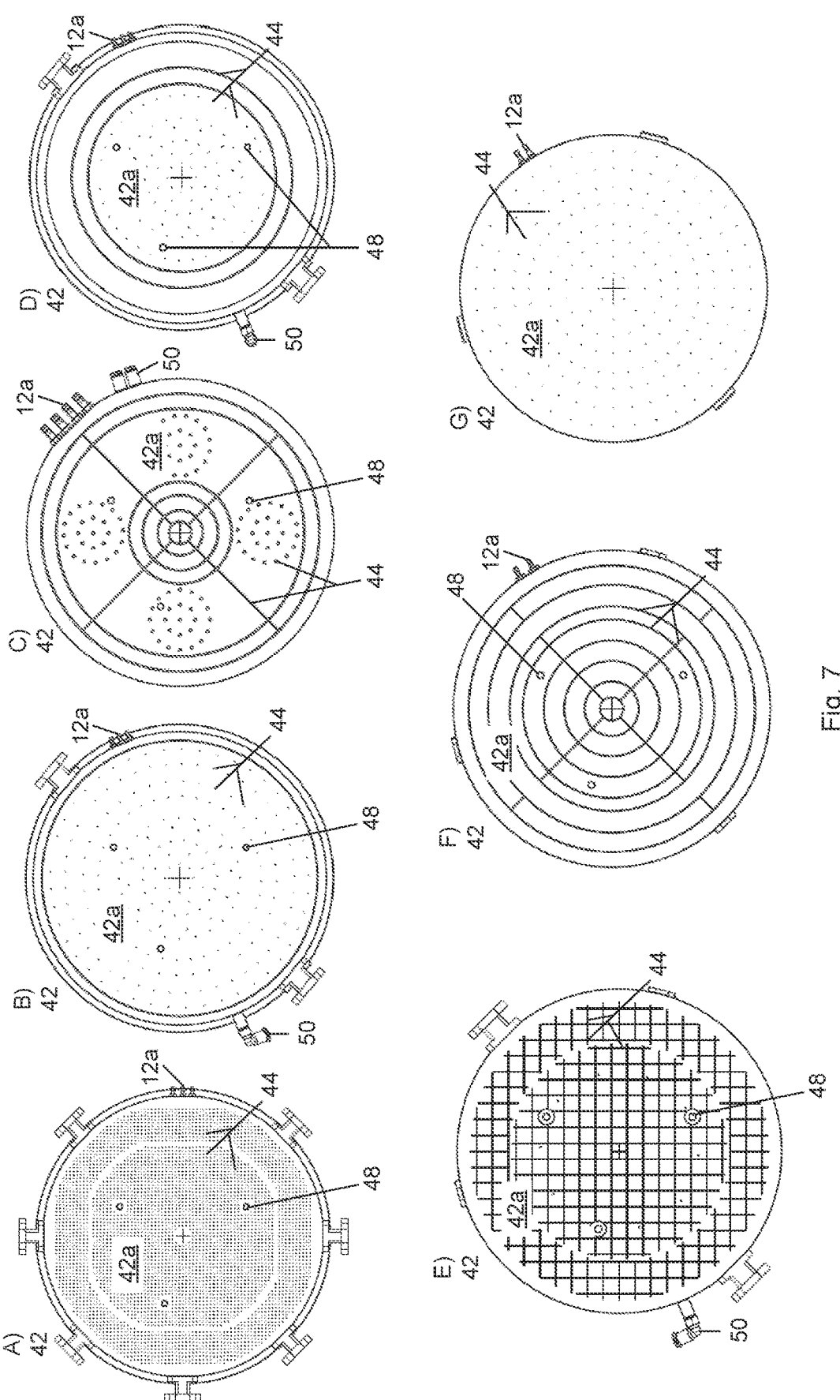
FIG. 7 shows exemplary embodiments of sensor modules for a modular wafer-chuck system.

FIG. 7 shows exemplary embodiments of a sensor module 42 for a modular wafer-chuck system 40 with different vacuum structures or vacuum patterns, i.e. a configuration and/or arrangement of one or more vacuum chambers 44, in particular depressions and/or holes and/or grooves and/or notches in the first coupling surface 42a of the sensor module 42. For secure mounting or clamping of a wafer, a substantially uniform distribution of the vacuum chambers 44 across the first coupling surface 42a of the sensor module 42 is particularly advantageous to guarantee a secure hold of the wafer without a concentrated or zonally overload of the wafer 2. Alternatively, and/or in addition, a wafer 2 can be mounted or clamped by means of an applied magnetic field.

The sensor module 42 of the embodiments A) and B) comprises e.g. a plurality of substantially punctiform vacuum chambers 44 on the first coupling surface 42a. In addition, the exemplary embodiment A) and B) shown has at least one, for example 3, vias 48 that can conduct a negative pressure from the chuck 1 through the sensor module 42 to the wafer 2. By providing one or more vias 48, a wafer can be mounted or clamped on a sensor module 42 without the sensor module 42 having to be connected e.g. to a vacuum pump 54 or having to generate a magnetic field.

The embodiment D) also has two vacuum chambers, each in the form of a substantially circular groove and/or notch.

The sensor modules 42 of the embodiments A), B), C), D), F) and G) exhibit one or more first communication interfaces 12a configured to transmit electrical signals from at least one temperature-measuring means 6 of the respective sensor module 42 to a temperature-measuring unit 43. Depending on the number and/or arrangement of the temperature-measuring means 6, for example corresponding to different sectors, the sensor module 42 can have a plurality of first communication interfaces 12a. Alternatively and/or in addition, one or more first communication interfaces 12a have a plurality of electrical connections, for example cable lines.

A sensor module 42 can have a plurality of, for example four, sectors that can each be designed substantially identically or differently. Advantageously, one wafer 2 can be arranged or mounted or clamped in each case on one sector of the sensor module 42. The embodiment C) comprises substantially identical vacuum patterns in four symmetrically distributed sectors on the first coupling surface 42*a* of the sensor module 42. The sensor module 42 C) accordingly comprises four first communication interfaces 12*a*, with one communication interface 12*a* being assigned to a sector and being connected to one or more temperature-measuring means 6 of the respective sector.

According to a preferred embodiment, the sensor module 42 C) comprises several, for example two, connection devices 50, so that mounting or clamping of a wafer on one or more sectors can take place independently of the one or more other sectors. Alternatively, certain parts or portions of the vacuum structure can be connected to different connection devices 50, so that a negative pressure and/or a vacuum can only be applied to one part of the vacuum structure.

The exemplary embodiment E) comprises a single connection device 50 for connection to a vacuum line 52 and a vacuum pattern with a plurality of substantially straight, orthogonally arranged and intersecting grooves or notches. The embodiment F) comprises a plurality of substantially concentrically arranged circular grooves or notches and some grooves or notches connecting them and extending in a radial direction and in a straight line.

The sensor module 42 according to embodiment G) has a plurality of substantially punctiform vacuum chambers 44 and no vias 48.

The exemplary sensor modules 42 shown in FIG. 7 can have one or more temperature-measuring means 6 (not shown) in different arrangements. Depending on the requirement, in particular the size and/or number of wafers 2 to be mounted or clamped and/or the layout of the structures to be tested on the wafers 2, arrangements of different complexity with different numbers and/or positioning and/or alignments of temperature-measuring means can be provided. Exemplary arrangements are shown in FIGS. 3 and 8.

The embodiments shown in FIGS. 6 and 7 can furthermore have one or more features of the embodiments of FIGS. 1, 2, 3 and 5.

FIG. 8 shows an exemplary arrangement of temperature-measuring means 6 in or on a sensor module 42 for a modular wafer-chuck system 40. In the example shown, the plurality of temperature-measuring means 6 are attached to a circuit board 56 and are preferably substantially symmetrical and/or evenly distributed across the first coupling surface 42*a* of the sensor module 42. The sensor module 42 advantageously has one or more recesses into which the circuit board 56 and the temperature-measuring means 6 are at least partially placed and/or embedded and/or set in.

A circuit board 56 with temperature sensors is also advantageous, since replacement is simplified in the event of a defect in one or more sensors. Likewise, only the circuit board can be adapted to a changed structure to be tested, without the chuck 1 and/or the sensor module 42 having to be exchanged. Moreover, a partially and/or fully automatic production of the circuit board 56 is cost-saving and time-efficient.

The present disclosure also relates to the following examples:

Example 1. A method for temperature control or regulation of a chuck (1) for a wafer (2), comprising the steps of:

detecting the position of a test means (22) for testing a wafer (2);

determining the respective spatial distances between the test means (22) and a plurality of temperature-measuring means (6) for measuring a temperature of the chuck (1) or of the sensor module (42) or of a wafer (2) mounted or clamped by the chuck (1);

selecting at least one temperature-measuring means (6) from the plurality of temperature-measuring means (6) as a reference temperature-measuring means;

controlling or regulating the temperature of the chuck (1) based on the temperature(s) of the chuck (1) or of the sensor module (42) or of the wafer (2) measured by the selected reference temperature-measuring means.

Example 2. The method according to example 1, wherein selecting a temperature-measuring means (6) as a reference temperature-measuring means comprises:

selecting the temperature-measuring means (6) that has the smallest spatial distance from the test means (22).

Example 3. The method as above, wherein selecting the at least one reference temperature-measuring means, provided that the determined spatial distances of two or more temperature-measuring means (6) are within a certain tolerance T± and/or are substantially the same, comprises:

selecting the temperature-measuring means (6) among the two or more temperature-measuring means (6) that has the greatest amount of temperature difference Tdiff and/or temperature change per time Tgrad; or selecting the two or more temperature-measuring means (6) as reference temperature-measuring means, wherein the control or regulation of the temperature of the chuck (1) is based on the mean or average of the temperatures measured by the reference temperature-measuring means.

Example 4. The method according to example 3, wherein the temperature difference Tdiff is the amount of the difference between the measured temperature T(t) and:

a target temperature of the chuck (1) or of the wafer (2) Tsoll; or a previously measured temperature T(t-x) of the same temperature-measuring means; or corresponds to an average temperature of a plurality of temperature-measuring means (6) Tavg.

Example 5. The method according to example 3, wherein the temperature change per time Tgrad is compared within a specific period of time t1.

Example 6. The method as above, wherein the spatial distance between the test means (22) and a temperature-measuring means (6) is determined based on vector coordinates.

Example 7. A temperature control device (10) for temperature control of a chuck (1) and/or of a wafer (2) mounted or clamped by a chuck (1), comprising:

a first communication interface (12*a*) for communicating with a chuck (1), the first communication interface being suitable for transmitting electrical signals;

a control unit (14) in connection with the first communication interface (12*a*) for:

receiving electrical signals from a plurality of temperature-measuring means (6) for measuring the temperature of the chuck (1) or of the sensor module (42) or of a wafer (2);

selecting at least one of the temperature-measuring means (6) as a reference temperature-measuring means;

controlling or regulating the temperature of the chuck (1) based on the temperature(s) of the chuck (1) or of the sensor module (42) or of the wafer (2) measured by the selected reference temperature-measuring means.

Example 8. The temperature control device according to example 7, wherein the control unit (14) is suitable for selecting the temperature-measuring means (6) that has the smallest spatial distance from a test means (22) for testing the wafer (2) as a reference temperature-measuring means.

Example 9. The temperature control device (10) according to example 7 or 8, wherein the control unit (14) is suitable for selecting the temperature-measuring means (6) that has the greatest amount of a temperature difference Tdiff and/or temperature change per time Tgrad as a reference temperature-measuring means, provided that the determined spatial distances of two or more temperature-measuring means (6) are within a certain tolerance T± and/or are substantially the same size.

Example 10. The temperature control device (10) according to an example of examples 7-9, further comprising:
a second communication interface (12b) for supplying and/or draining a temperature control medium (18) for controlling the temperature of the chuck (1) into or out of the chuck (1); and/or
a third communication interface (12c) for communicating with at least one electrothermal converter (9) for controlling the temperature of the chuck (1).

Example 11. A wafer test system (20) for testing a wafer, comprising:
a chuck (1) for mounting or clamping and temperature control of a wafer (2), comprising a plurality of temperature-measuring means (6) for measuring a temperature of the chuck (1) or of a wafer (2) mounted or clamped by the chuck (1) or the sensor module (42);
at least one test means (22) for testing the wafer (2);
a position detection means (24) for detecting the position of the test means (22) in relation to the chuck (1) or the sensor module (42) or the wafer (2);
a temperature control device (10) according to one of examples 7 to 10.

LIST OF REFERENCE NUMERALS 1 chuck
2 wafer
3 wafer surface
4 structure to be tested
6 temperature-measuring device
8 medium line
9 electrothermal converter
10 temperature control device
12 communication interface
14 control unit
18 temperature control medium
20 wafer test system
22 test means
23 probe needle
24 probe card
25 circuit board
26 contact element
28 position detection means
30 first temperature control circuit
32 second temperature control circuit
40 wafer-chuck system
42 sensor module 43 temperature-measuring unit
44 vacuum chamber
46 insulation layer
48 via
50 connection device
52 vacuum line
54 vacuum pump
56 circuit board

The invention claimed is:
1. A modular wafer-chuck system (40) for mounting or clamping and temperature control of a wafer (2), comprising:
a chuck (1) for temperature control of a wafer (2);
a sensor module (42) comprising at least one temperature-measuring means (6) for measuring a temperature of the sensor module (42) and/or of the chuck (1) and/or of a wafer (2) mounted or clamped by the wafer-chuck system;
wherein the chuck (1) has a coupling surface (1a) configured to detachably couple the sensor module (42); and
wherein the sensor module (42) has a first coupling surface (42a) configured to mount or clamp a wafer (2), and a second coupling surface (42b) for coupling with the coupling surface (1a) of the chuck (1) with the aid of a negative pressure and/or a vacuum and/or an applied magnetic field; and
wherein the first coupling surface (42a) of the sensor module (42) is arranged on a side of the sensor module (42) facing away from the chuck (1).

2. The modular wafer chuck system (40) of claim 1, wherein the chuck (1) and/or the sensor module (42) are self-contained units and can be used individually and/or independently of one another.

3. The modular wafer-chuck system (40) of claim 1, wherein the chuck and/or the sensor module (42) comprises at least one vacuum chamber (44) for mounting or clamping a wafer.

4. The modular wafer-chuck system (40) of claim 3, wherein the chuck and/or the sensor module (42) have at least one connection device (50) for connecting a vacuum line (52).

5. The modular wafer-chuck system (40) of claim 1, further comprising an insulation layer (46) for detachable coupling with the chuck (1) and/or the sensor module (42).

6. The modular wafer-chuck system (40) of claim 1, wherein the sensor module (42) comprises a first communication interface (12a) for communicating with a temperature-measuring unit (43), wherein the first communication interface (12a) is suitable for transmitting electrical signals from the at least one temperature-measuring means (6), and the temperature-measuring unit (43) is suitable for receiving electrical signals from the at least one temperature-measuring means (6) of the sensor module (42).

7. The modular wafer-chuck system (40) of claim 1, wherein the chuck (1) for temperature control of the chuck (1) and/or of the sensor module (42) and/or of a mounted or clamped wafer (2) comprises:
a second communication interface (12b) for supplying and/or draining a temperature control medium (18) into or out of the chuck (1); and/or
a third communication interface (12c) for communicating with at least one electrothermal converter (9) of the chuck (1).

8. The modular wafer-chuck system (40) of claim 7, further comprising:

a control unit (14) of a temperature control device (10) in connection with the temperature-measuring unit (43) and the second and/or third communication interface (12b, 12c) for:

controlling or regulating the temperature of the chuck (1) and/or of the sensor module (42) and/or of the wafer (2) based on the measured temperature of the sensor module (42) and/or of the chuck (1) and/or of the wafer (2).

9. The modular wafer-chuck system (40) of claim 1, further comprising:

a first communication interface (12a) for communicating with the chuck (1), the first communication interface being suitable for transmitting electrical signals;

a control unit (14) in connection with the first communication interface (12a) for:

receiving electrical signals from a plurality of temperature-measuring means (6) in the sensor module (42);

selecting at least one of the temperature-measuring means (6) as a reference temperature-measuring means;

controlling or regulating the temperature of the chuck (1) based on the temperature(s) of the sensor module (42) or of the chuck (1) or of the wafer (2) measured by the selected reference temperature-measuring means.

10. A sensor module (42) for coupling to a chuck (1) of a modular wafer-chuck system (40), comprising:

at least one temperature-measuring means (6) for measuring a temperature of the sensor module (42) and/or of a coupled chuck (1) and/or of a wafer (2) mounted or clamped by the sensor module (40) and/or by the chuck (1);

a first coupling surface (42a) for mounting or clamping a wafer (2); and a second coupling surface (42b) for coupling with a chuck (1) with the aid of negative pressure and/or vacuum and/or an applied magnetic field, wherein the first coupling surface (42a) of the sensor module (42) is configured to be arranged on a side of the sensor module (42) facing away from the chuck (1).

11. The sensor module (40) of claim 10, further comprising:

a plurality of temperature-measuring means (6); and/or at least one vacuum chamber (44) for mounting or clamping a wafer (2); and/or a connection device (50) for connecting a vacuum line (52); and/or a first communication interface (12a) for communicating with a temperature-measuring unit (43) for controlling the temperature of a chuck (1), wherein the first communication interface (12a) is suitable for transmitting electrical signals from the at least one temperature-measuring means (6), and the temperature-measuring unit (43) is suitable for receiving electrical signals from the at least one temperature-measuring means (6) of the sensor module (42).

12. A method for arranging modules of a modular wafer-chuck system (40), comprising:

providing a chuck (1) for temperature control of a wafer (2);

coupling a sensor module (42) to a coupling surface (1a) of the chuck (1) with the aid of negative pressure and/or vacuum and/or an applied magnetic field;

wherein the sensor module (42) comprises:

a first coupling surface (42a) configured to mount or clamp a wafer (2); and at least one temperature-measuring means (6) for measuring a temperature of the sensor module (42) and/or of the chuck (1) and/or of a wafer (2) mounted or clamped by the wafer-chuck system wherein the first coupling surface (42a) of the sensor module (42) is configured to be arranged on a side of the sensor module (42) facing away from the chuck (1).

13. The method of claim 12, further comprising the step of:

mounting or clamping a wafer (2) with a second coupling surface (42a) of the sensor module; and, preferably, temperature control of the chuck (1), the sensor module (42) and/or the mounted or clamped wafer (2).

14. The method of claim 13, further comprising the steps of:

detecting the position of a test means (22) for testing a wafer (2);

determining the respective spatial distances between the test means (22) and a plurality of temperature-measuring means (6) for measuring a temperature of the chuck (1) or of the sensor module (42) or of a wafer (2) mounted or clamped by the chuck (1);

selecting at least one temperature-measuring means (6) among the plurality of temperature-measuring means (6) as a reference temperature-measuring means;

controlling or regulating the temperature of the chuck (1) based on the temperature(s) of the chuck (1) or the sensor module (42) or the wafer (2) measured by the selected reference temperature-measuring means.

15. The method of claim 12, further comprising the steps of:

detecting the position of a test means (22) for testing a wafer (2);

determining the respective spatial distances between the test means (22) and a plurality of temperature-measuring means (6) for measuring a temperature of the chuck (1) or of the sensor module (42) or of a wafer (2) mounted or clamped by the chuck (1);

selecting at least one temperature-measuring means (6) among the plurality of temperature-measuring means (6) as a reference temperature-measuring means;

controlling or regulating the temperature of the chuck (1) based on the temperature(s) of the chuck (1) or the sensor module (42) or the wafer (2) measured by the selected reference temperature-measuring means.

* * * * *